(12) United States Patent
Mohanty et al.

(10) Patent No.: US 7,911,936 B2
(45) Date of Patent: Mar. 22, 2011

(54) TECHNIQUES TO REDUCE OVERHEAD IN OFDMA BASED WIRELESS NETWORKS

(75) Inventors: Shantidev Mohanty, Hillsboro, OR (US); Muthaiah Venkatachalam, Beaverton, OR (US); Shailender Timiri, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 319 days.

(21) Appl. No.: 11/690,741

(22) Filed: Mar. 23, 2007

(65) Prior Publication Data
US 2008/0101213 A1 May 1, 2008

Related U.S. Application Data

(60) Provisional application No. 60/855,575, filed on Oct. 30, 2006.

(51) Int. Cl.
*H04J 11/00* (2006.01)
(52) U.S. Cl. ........................... 370/208; 370/338
(58) Field of Classification Search .......... 370/208, 370/310; 455/435, 436
See application file for complete search history.

(56) References Cited

U.S. PATENT DOCUMENTS

| | | | | |
|---|---|---|---|---|
| 5,481,687 A | * | 1/1996 | Goubert et al. | 711/212 |
| 6,639,899 B1 | * | 10/2003 | Law et al. | 370/242 |
| 2005/0041573 A1 | * | 2/2005 | Eom et al. | 370/208 |
| 2005/0201269 A1 | * | 9/2005 | Shim et al. | 370/208 |
| 2005/0286407 A1 | * | 12/2005 | Park et al. | 370/208 |
| 2007/0274253 A1 | * | 11/2007 | Zhang et al. | 370/328 |
| 2007/0286066 A1 | * | 12/2007 | Zhang et al. | 370/208 |
| 2008/0026750 A1 | * | 1/2008 | Harris et al. | 455/435.1 |

* cited by examiner

*Primary Examiner* — Ricky Ngo
*Assistant Examiner* — Rasheed Gidado
(74) *Attorney, Agent, or Firm* — Cool Patent, P.C.; Joseph P. Curtin

(57) ABSTRACT

An embodiment of the present invention provides a method, comprising reducing overhead in OFDMA based Wireless Networks by determining the highest CIDs to be transmitted in a particular DL/UL MAP and determining the number of leading zero bits of the highest CID and removing the leading zero bits from each CID prior to transmission. Further, an embodiment of the present invention provides removing the CID field in the header of the message identified by a particular CID.

24 Claims, 3 Drawing Sheets

TECHNIQUES TO REDUCE OVERHEAD IN OFDMA BASED WIRELESS NETWORKS

CROSS-REFERENCE TO RELATED APPLICATION

This application claims the benefit of Provisional Patent Application Ser. No. 60/855,575, filed 30 Oct. 2006, entitled "TECHNIQUES TO REDUCE OVERHEAD IN OFDMA BASED WIRELESS NETWORKS", by Mohanty et al.

BACKGROUND

Fixed length encoding is widely used to encode symbols and event outcomes that have equal probability of occurrence. For example, if an event has 240 equally probable outcomes, each of these outcomes are encoded using 8 bits. Similarly, if a communication system is designed to support a maximum of 1000 users, each user is given a 10 bit identification (ID). This constant length ID encoding is efficient when the number of users in the communication system is close to the maximum number of users for which the system is designed. If the number of users at a particular time is much less than the maximum number of users, the fixed length coding is not efficient and suffers from higher than required overhead. This is true for the encoding of identifiers such as connection identifiers (CIDs) in OFDMA based IEEE 802.16 networks.

Thus, a strong need exists for techniques to reduce overhead and increase efficiency in wireless networks such as IEEE 802.16 based networks.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
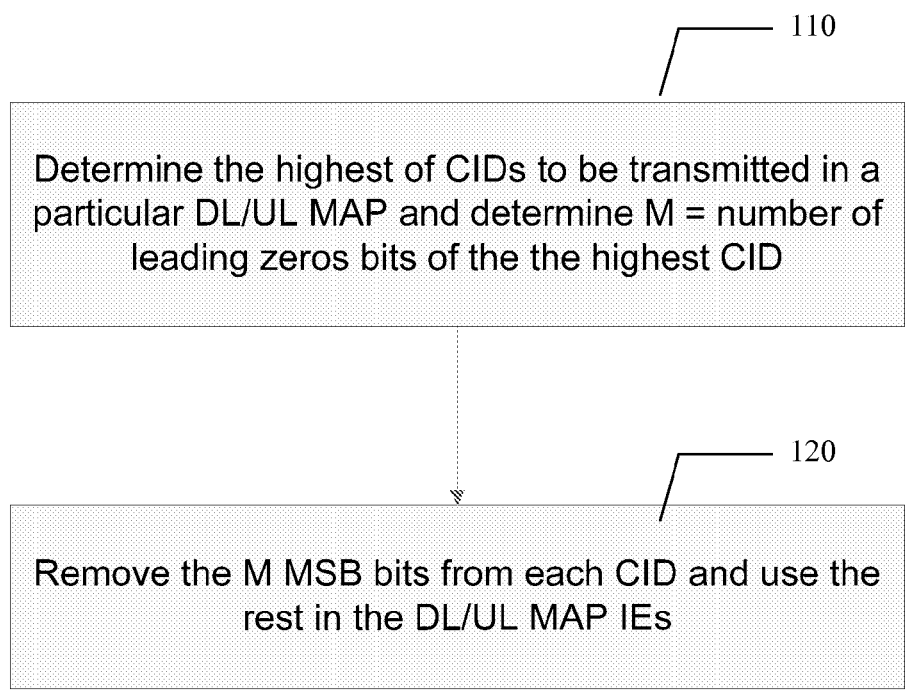
FIG. 1 is a flow chart illustrating the method of an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, units and/or circuits have not been described in detail so as not to obscure the invention.

Embodiments of the invention may be used in a variety of applications. Some embodiments of the invention may be used in conjunction with various devices and systems, for example, a transmitter, a receiver, a transceiver, a transmitter-receiver, a wireless communication station, a wireless communication device, a wireless Access Point (AP), a modem, a wireless modem, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, a network, a wireless network, a Local Area Network (LAN), a Wireless LAN (WLAN), a Metropolitan Area Network (MAN), a Wireless MAN (WMAN), a Wide Area Network (WAN), a Wireless WAN (WWAN), devices and/or networks operating in accordance with existing IEEE 802.11, 802.11a, 802.11b, 802.11e, 802.11g, 802.11h, 802.11i, 802.11n, 802.16, 802.16d, 802.16e standards and/or future versions and/or derivatives and/or Long Term Evolution (LTE) of the above standards, a Personal Area Network (PAN), a Wireless PAN (WPAN), units and/or devices which are part of the above WLAN and/or PAN and/or WPAN networks, one way and/or two-way radio communication systems, cellular radio-telephone communication systems, a cellular telephone, a wireless telephone, a Personal Communication Systems (PCS) device, a PDA device which incorporates a wireless communication device, a Multiple Input Multiple Output (MIMO) transceiver or device, a Single Input Multiple Output (SIMO) transceiver or device, a Multiple Input Single Output (MISO) transceiver or device, a Multi Receiver Chain (MRC) transceiver or device, a transceiver or device having "smart antenna" technology or multiple antenna technology, or the like. Some embodiments of the invention may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carrier Modulation (MDM), Discrete Multi-Tone (DMT), Bluetooth®, ZigBee™, or the like. Embodiments of the invention may be used in various other apparatuses, devices, systems and/or networks.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations.

As an exemplary embodiment, consider the connection identifier (CID) parameter of the institute for electronic and electrical engineer (IEEE) 802.16 standard that is encoded with a fixed length of 16 bits. Thus, the maximum number of CIDs that can be supported is 2^16 hereafter referred to as MAX_CID_NUMBER. CIDs are used in the downlink MAP (DL MAP) and uplink MAP (UL MAP) of a frame to identify the MAP information elements (IE) of different users. When the number of CIDs used in an IEEE 802.16 based network N<<MAX_CID_NUMBER, 16−greatest integer [log 2(N)] number of leading bits of each CID are always zero, where the 'greatest integer' indicates rounding to the next highest integer. For example, when 1000 CIDs are used in the network, 1000−greatest integer [log 2(1000)]=6 bits of each CID which are always zero. Transmission of this zero does not convey any information and consumes expensive radio resources. These bits are referred to as unnecessary leading zero bits.

In OFDMA frames of the IEEE 802.16 standard, CID is repeated in DL/UL MAP IEs and in MAC headers. CID in both DL/UL MAP IEs and the MAC headers convey the same information. Therefore, their presence at both places is redundant and adds to the overhead of an OFDMA frame.

Some embodiments of the present invention reduces the overhead in the OFDMA frames through following methodologies:

1. It eliminates the transmission of unnecessary leading zero bits of CIDs in DL/UL MAP IEs. Thus, it achieves better utilization of the radio resources. It may be noted that this technique can also be applied to other information transfer scenarios such as information transfer in wired networks and wireless networks using other wireless standards.
2. It eliminates the repetition of CID in both DL/UL MAP IEs and MAC headers in an OFDMA frame. Thus, it reduces the overhead in an OFDMA frame.

An embodiment of the present invention provides a methodology to eliminate the transmission of leading zero bits CIDs in DL/UL MAP IEs. A further embodiment of the present invention uses the CID information only in DL/UL MAP IEs instead of using it at both DL/UL MAP IEs and MAC headers of an OFDMA frame.

It may be noted that one particular implementation may use both methodology 1 and methodology 2 or either one of these methodologies. However, the present invention is applicable irrespective of whether both or either one of them is used.

These methodologies are as follows.

Methodology 1:

In this method, first the highest value of the CIDs in a particular DL/UL MAP is determined. Then, all the CIDs have at least M number of leading bits, where M is the number of leading zero bits of the highest CID. Therefore, M leading zero bits is removed from all the CIDs and the remaining bits are transmitted. For example, and not by way of limitation, in IEEE 802.16e based networks, where the CID has 16 bits, only 16−M bits are used for each CID in the DL/UL MAP IEs. This is described with reference to FIG. 1, which provides at 110 determining the highest of CIDs to be transmitted in a particular DL/UL MAP and determining M=number of leading zeros bits of the highest CID. At 120, remove the M MSB bits from each CID and use the rest in the DL/UL MAP IEs.

This can be implemented in many different ways, however, in an embodiment of the present invention, a one bit flag may be used in the DL MAP to indicate whether the leading zero bits of the CIDs are transmitted or not. A positive value of the flag indicates that the leading zero bits of CIDs are not transmitted. When the flag is positive, it is followed by a number that specifies the number of leading bits, M, that are removed from each CID. If the default length of CIDs is R, then the actual length of each CID is R−M. For example, for IEEE 802.16e, in the presence of positive indication, the number of bits used to encode each CID in the DL MAP IEs is 16−M.

The above description illustrates one method to implement the proposed invention. However, it is understood that other methods may be used to eliminate the transmission of leading zeros and the proposed invention is applicable irrespective of the method used. By eliminating the transmission of leading zeros, the proposed invention reduces the average number of bits to encode CIDs.

Although, the proposed invention is applicable irrespective of the methodology used for the allocation of CIDs, its advantage can be maximized when the CIDs are allocated in an ascending order. This way, the first allocated CID is the lowest CID in the entire CID space (the set of all possible CID). The second allocated CID is the second lowest available value in the CID space and so on.

In an embodiment of the present invention, one possible algorithm that allocates CIDs based on this algorithm divides the available CID space in to two sets: assigned CIDs set (ACS); and non-assigned CIDs (NACS). The available CID space contains all the CIDs that can be allocated to users. It may be noted that in the context of IEEE 802.16e standard there are some CIDs that are reserved for different purposes, e.g., initial ranging CID, padding CID, multicast CID etc. Thus, the available CID space excludes the CIDs that are reserved for special purposes. ACS contains those CIDs of available CID space that are allocated to different users and NACS contains those CIDs of available CID space that are available to be allocated in future. The smallest element of NACS at any given time is denoted by next CID, i.e., next CID=min (NACS). Thus, at the time of initialization ACS={ }, NACS={0, 1, 2, 3, 4, . . . , S}, where {0, 1, 2, 3, . . . S} is the CID space, and next CID=0. There first requested CID is assigned 0. After this, ACS={0} and NACS={1, 2, 3, 4, . . . N}. Now the next CID=1. Therefore, the second requested CID is assigned 1 and after this, ACS={0, 1} and NACS={2, 3, 4, . . . N}. The new value of next CID=2. Similarly, the third request CID is assigned 2. At this time, if the user with CID=1, exit from the network, then CID=1 is removed from the ACS and added to the NACS. Thus, after this event ACS={0, 2} and NACS={1, 3, 4, 5, 6 . . . N}. Now, the next CID=1.

Figure 2:
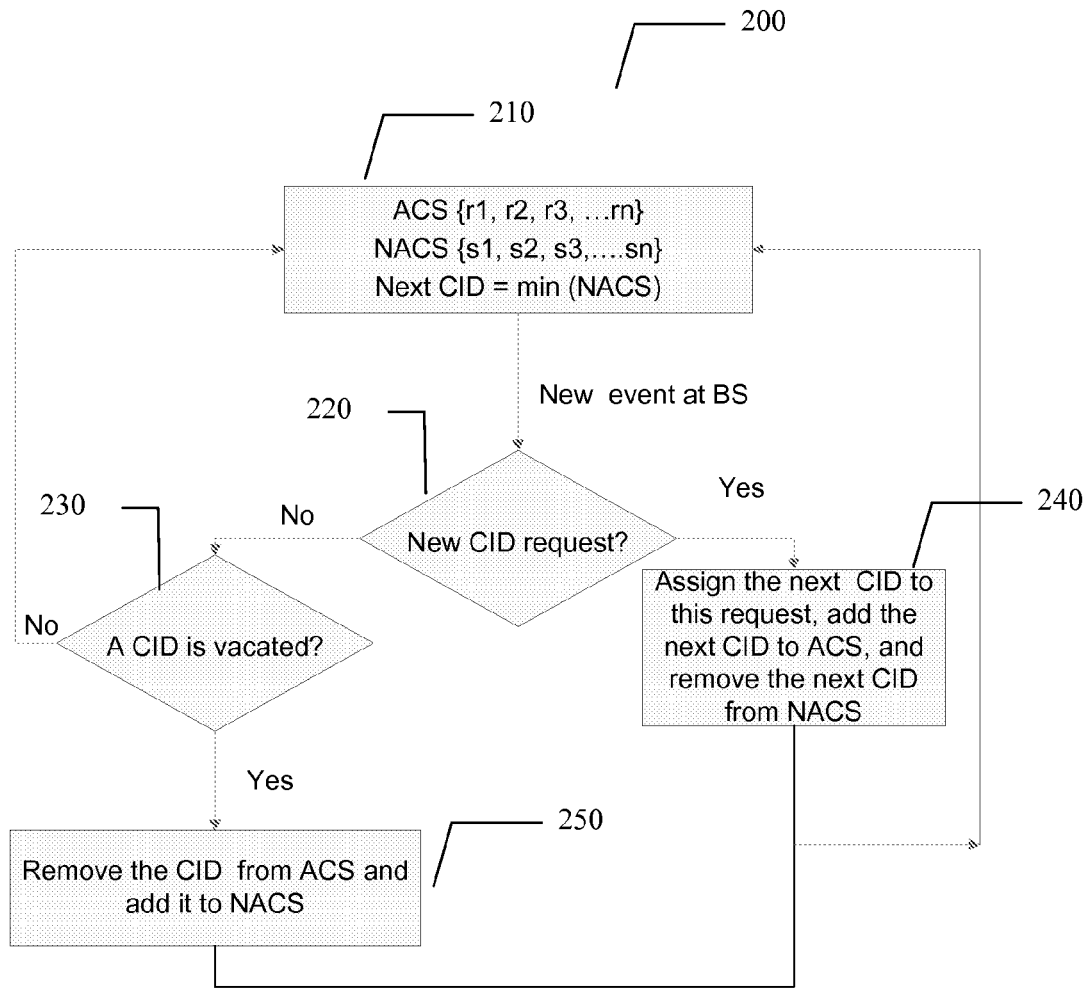
FIG. 2 provides a flow diagram showing the CID allocation process of an embodiment of the present invention.
Figure 3:
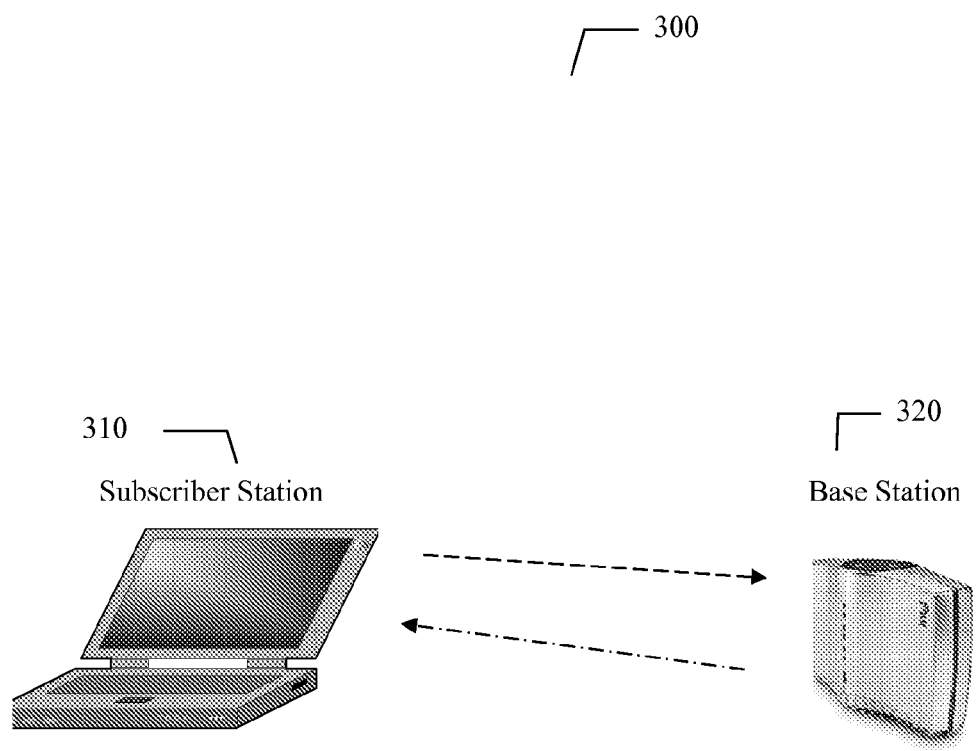
FIG. 3 is a system according to an embodiment of the present invention.

This CID allocation algorithm is generally illustrated in the flow chart in FIG. 2 at 200. At 210 ACS contains the CIDs that are allocated to different users and NACS contains the CIDs that are available to be allocated in future and Next CID=min (NACS). After a new event at base station, a determination is made at 220 if a new CID request has been made. If yes at 220, at 240 assign the next CID to this request, add the next CID to ACS, and remove the next CID from NACS and return to 210. If no at 220, a determination is made at 230 if a CID is vacated. If no at 230 a return to step 210 is accomplished. If yes at 230, at 250 remove the CID from ACS and add it to NACS and return to step 210.

For illustration purpose, one possible implementation of the invention in IEEE 802.16e based networks is described as follows.

The formats of the current DL-MAP message of the IEEE 802.16e standard are shown in Table 1 below.

TABLE 1

DL-MAP message format.

| Syntax | Size | Note |
| --- | --- | --- |
| DL-MAP_Message_Format ( ) { | | |
| Management Message Type =2 | 8 bits | |
| PHY Synchronization Field | variable | Depends on the PHY specification |
| DCD count | 8 bits | |
| Base Station ID | 48 bits | |
| Begin PHY Specific Section { | | Depends on the PHY specification |
| If (WirelessMAN-OFDMA) { | | |
|    No. OFDMA symbols | 8 bits | Number of OFDMA symbols in the DL sub-frame including all AAS/permutation zone |
| } | | |
| for (i=1; i<= n; i++) { | | For each DL-MAP element 1 to n |
|    DL-MAP_IE ( ) | Variable | Depends on the PHY specification |
| } | | |
| } | | |
| if !(byte boundary) { | | |
|    Padding Nibble | 4 bits | Padding to reach bit boundary |
| } | | |
| } | | |

The part of the DL-MAP_IE of the DL-MAP message that specifies the CID field is shown in Table 2 below.

TABLE 2

The portion of a DL-MAP_IE that shows CID specification.

| Syntax | Size | Note |
| --- | --- | --- |
| N_CID | 8 bits | Number of CIDs assigned for this IE |
| For (i=1; i<= N_CID; i++) | | |
| { | | |
|    CID | 16 bits | |
| } | | |

When the proposed invention is used, possible formats for DL-MAP and CID portion of the DL-MAP_IE are shown in Table 3 and Table 4, respectively below.

TABLE 3

A possible DL-MAP message format to implement the proposed invention

| Syntax | Size | Note | |
| --- | --- | --- | --- |
| DL-MAP_Message_Format ( ) { | | | |
| Management Message Type =2 | 8 bits | | |
| PHY Synchronization Field | variable | Depends on the PHY specification | |
| DCD count | 8 bits | | |
| Base Station ID | 48 bits | | |
| Compressed_CID_Used | 1 bit | Flag to denote if the leading zeros of CIDs are eliminated 1: leading zeros are eliminated 0: leading zeros are not eliminated | |
| If (Compressed_CID_Used) { | | | |
|    No. Leading bits eliminated | 4 bits | The number of leading zeros of the CIDs that are eliminated, M. | Comment [sm1]: Just to introduce the parameter M used in Table 4. |
| } | | | |
| Begin PHY Specific Section { | | Depends on the PHY specification | |
|    If (WirelessMAN-OFDMA) { | | | |
|       No. OFDMA symbols | 8 bits | Number of OFDMA symbols in the DL sub-frame including all AAS/permutation zone | |
|    } | | | |
|    for (i=1; i<= n; i++) { | | For each DL-MAP element 1 to n | |
|       DL-MAP_IE ( ) | Variable | Depends on the PHY specification | |
|    } | | | |
| } | | | |

TABLE 3-continued

A possible DL-MAP message format to implement the proposed invention

| Syntax | Size | Note |
| --- | --- | --- |
| if !(byte boundary) {<br>  Padding Nibble<br>  }<br>} | 4 bits | Padding to reach bit boundary |

TABLE 4

The CID portion of a DL-MAP-IE when the proposed invention is used.

| Syntax | Size | Note |
| --- | --- | --- |
| N_CID | 8 bits | Number of CIDs assigned for this IE |
| For (i=1; i<= N_CID; i++) {<br>  CID<br>  } | 16-M bits | |

For exemplification, we may consider different scenarios with different numbers of active CIDs and the reduction in overhead associated with the DL/UL MAP IEs is shown in Table 5 below when the proposed invention is used.

TABLE 5

Performance gain of the proposed invention.

| Number of CIDs | Number of bits used in the current IEEE 802.16e standard | Number of bits used when the invention is used | Number of overhead bits saved | Percentage of overhead saving when invention is used |
| --- | --- | --- | --- | --- |
| 100 | 16 | 7 | 9 | 56 |
| 200 | 16 | 8 | 8 | 50 |
| 500 | 16 | 9 | 7 | 43 |
| 1000 | 16 | 10 | 6 | 37 |
| 5000 | 16 | 13 | 3 | 18 |

Methodology 2:

As shown in Table 4, N_CID number of CIDs is put next to one another in the DL-MAP_IE. Each of these CIDs has 16−M number of bits. It may be noted that some of these CIDs may have leading zeros. The proposed methodology 2 may be used to eliminate these leading zeros to further reduce the average number of bits per CID. This is achieved by grouping the CIDs into different classes as follows. We consider a scenario when 16−M=8, N_CID=10, and the CIDs are {00000011, 00111110, 10101010, 11000011, 0000111, 00011001, 00000111, 00001010, 00111111, 00101010}.

The proposed algorithm first arranges these CIDs in the increasing order of their numerical values. Then, the CIDs are grouped into r groups such that CIDs in each group have at least s number of leading zeros. Then, the s leading zeros of each group is removed. The information about r and s in each group as well as the number of CIDs in each group is specified first. Then, the CIDs of each group are mentioned one by one. This algorithm is described using the above 10 CIDs.

1. The sorted list of CIDs is
    00000011
    00000111
    00001111
    00001010
    00011001
    00101010
    00111110
    00111111
    10101010
    11000011

2. These CIDs may be grouped into three groups: first group contains the first four CIDs {00000011, 00000111, 00001111, 00001010}, second group contains the next four CIDs {00011001, 00101010, 00111110, 0011111}, and the third group contains the remaining two CIDs {10101010, 11000011}.
3. It can observed that for the first group s=4, for the second group s=2 and for the third group s=0.
4. The algorithm may use one header whose structure is defined as follows.

| r | N1 | N2 | ... | Nr − 1 | S1 | S2 | ... | Sr |
| --- | --- | --- | --- | --- | --- | --- | --- | --- |

Where Nj (j=1, 2, r−1) are the number of elements in the jth group. It may be noted that the number of CIDs in the rth group is N_CID−(N1+N2+ . . . Nr−1). Thus, it is not specified in the header. Si (i=1, 2, 3 . . . r) the number of leading zero that are removed from ith group. Thus, the header for the above three CID groups is

| 3 | 4 | 4 | 4 | 2 | 0 |
| --- | --- | --- | --- | --- | --- |

5. The header is followed by the CIDs after the leading zero are removed. In the above example (and it is understood that the present invention is not limited to the examples provided herein), what follows the header is {0011011111110100110011010101111011111110 10101011000011}.

As we observe, the methodologies provided herein eliminate the leading zeros of the CIDs by grouping them into different groups. However, it also requires extra bits to specify the number of groups, the size of each group and also the number of bits eliminated from each group. Therefore, this methodology should be used when the number of bits saved through the elimination of the leading zeros of the CIDs is more than what is consumed in to specify the number of groups, the size of each group and also the number of bits eliminated from each group.

The previous discussion illustrates how the CID information is used in the DL/UL MAP IEs to specify the resource allocation for different users in an OFDMA frame. These IEs points to different locations that contain information for different users in an OFDMA frame. This information consists of two parts: header followed by the actual message content. CID is one of the elements of this header. The purpose of CID is to specify the connection. However, this connection identification is already established though DL/UL MAP IEs.

Therefore, the CID information in the header does not carry any information. Therefore, in an embodiment of the present invention the CID field in the header should be eliminated. This reduces the overhead in an OFDMA frame.

Some embodiments of the invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

Some embodiments of the invention may be implemented, for example, using a machine-readable medium or article which may store an instruction or a set of instructions that, if executed by a machine, for example, by a system, by a station, by a processor or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like. In an embodiment of the present invention, the machine-accessible medium that provides instructions, which when accessed, may cause a machine to perform operations comprising reducing overhead in OFDMA based Wireless Networks by determining the highest CIDs to be transmitted in a particular DL/UL map and determining M=number of leading zero bits of the highest CID and removing the M MSB bits from each CID and using the rest in the DL/US Map IE.

Yet another embodiment of the present invention provides a system 300, comprising a base station (BS) 320; a subscriber station (SS) 310 that reduces overhead in OFDMA based Wireless Networks by determining the highest CIDs to be transmitted in a particular DL/UL map and determining M=number of leading zero bits of the highest CID; and removing the M MSB bits from each CID and using the rest in the DL/US Map IE.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

We claim:

1. An apparatus, comprising:
a transceiver that reduces overhead in orthogonal frequency-division multiple access (OFDMA) based Wireless Networks by determining the highest value of connection identifiers (CIDs) to be transmitted in the downlink/uplink map information elements (DL/UL MAP IEs) of a particular downlink/uplink map (DL/UL MAP) and determining the number of leading zero bits of the highest CID; and
removing said leading zero bits from each CID prior to transmission;
wherein a CID field in a media access control (MAC) header of a message identified by the CID is eliminated without replacing the eliminated CID with another identifier to reduce overhead in an OFDMA frame.

2. The apparatus of claim 1, further comprising using non leading zero bits in the DL/UL MAP IE(s).

3. The apparatus of claim 1, further comprising using a one bit flag in the DL MAP to indicate whether the leading zero bits of the CIDs are transmitted or not.

4. The apparatus of claim 3, wherein when said flag is positive, it is followed by a number that specifies the number of leading bits, that are removed from each CID.

5. The apparatus of claim 1, wherein said CIDs are allocated in an ascending order, with the first allocated CID being the lowest CID in the entire CID space.

6. The apparatus of claim 1, further comprising first arranging said CIDs in an increasing order of their numerical values, then said CIDs are grouped into r groups such that CIDs in each group have at least s number of leading zeros and the s leading zeros of each group are removed.

7. The apparatus of claim 6, wherein information about r and s in each group as well as the number of CIDs in each group are specified first, then said CIDs of each group are mentioned one by one.

8. A method, comprising:
reducing overhead in OFDMA orthogonal frequency-division multiple access (OFDMA) based Wireless Networks by determining the highest connection identifiers (CIDs) to be transmitted in a particular downlink/uplink map (DL/UL MAP) and determining the number of leading zero bits of the highest CID; and
removing said leading zero bits from each CID prior to transmission; and
further comprising eliminating a CID field in a media access control (MAC) header of a message identified by the CID to reduce overhead in an OFDMA frame without replacing the eliminated CID with another identifier.

9. The method of claim 8, further comprising using non leading zero bits in the downlink/uplink map information element(s) (DL/UL MAP IE(s)).

10. The method of claim 8, further comprising using a one bit flag in the DL MAP to indicate whether the leading zero bits of the CIDs are transmitted or not.

11. The method of claim 10, wherein when said flag is positive, it is followed by a number that specifies the number of leading bits, that are removed from each CID.

12. The method of claim 8, further comprising allocating said CIDs in an ascending order, with the first allocated CID being the lowest CID in the entire CID space.

13. The method of claim 8, further comprising arranging said CIDs in an increasing order of their numerical values, then grouping said CIDs are into r groups such that CIDs in each group have at least s number of leading zeros and the s leading zeros of each group are removed.

14. The method of claim 13, wherein information about r and in each group as well as the number of CIDs in each group is specified first, then said CIDs of each group are mentioned one by one.

15. A machine-accessible non-transitory medium that provides instructions, which when accessed, cause a machine to perform operations comprising:
reducing overhead in orthogonal frequency-division multiple access (OFDMA) based Wireless Networks by determining the highest connection identifiers (CIDs) to be transmitted in a particular downlink/uplink map (DL/UL MAP) and determining the number of leading zero bits of the highest CID; and
removing said leading zero bits from each CID prior to transmission; and
further comprising eliminating a CID field in a media access control (MAC) header of a message identified by the CID to reduce overhead in an OFDMA frame without replacing the eliminated CID with another identifier.

16. The machine-accessible non-transitory medium of claim 15, further comprising further instructions, which when accessed, cause a machine to perform operations further comprising using non leading zero bits in the downlink/uplink map information element(s) (DL/UL MAP IE(s)).

17. The machine-accessible non-transitory medium of claim 15, further comprising further instructions, which when accessed, cause a machine to perform operations further comprising using a one bit flag in the DL MAP to indicate whether the leading zero bits of the CIDs are transmitted or not.

18. The machine-accessible non-transitory medium of claim 15, wherein when said flag is positive, it is followed by a number that specifies the number of leading bits, that are removed from each CID.

19. The machine-accessible non-transitory medium of claim 15, further comprising further instructions, which when accessed, cause a machine to perform operations further comprising allocating said CIDs in an ascending order with the first allocated CID being the lowest CID in the entire CID space.

20. The machine-accessible non-transitory medium of claim 15, further comprising further instructions, which when accessed, cause a machine to perform operations further comprising arranging said CIDs in an increasing order of their numerical values, then grouping said CIDs are into r groups such that CIDs in each group have at least s number of leading zeros and the s leading zeros of each group are removed.

21. A system, comprising:
a base station (BS); and
a subscriber station (SS) that reduces overhead in orthogonal frequency-division multiple access (OFDMA) based Wireless Networks by determining the highest connection identifiers (CIDs) to be transmitted in a particular downlink/uplink map (DL/UL MAP) and determining the number of leading zero bits of the highest CID and removing said leading zero bits from each CID prior to transmission;
wherein a CID field in a media access control (MAC) header of a message identified by the CID is eliminated to reduce overhead in an OFDMA frame without replacing the eliminated CID with another identifier.

22. The system of claim 21, further comprising using non leading zero bits in the downlink/uplink map information element(s) (DL/UL MAP IE(s)).

23. The system of claim 22, further comprising using a one bit flag in the DL MAP to indicate whether the leading zero bits of the CIDs are transmitted or not.

24. The apparatus of claim 23, wherein when said flag is positive, it is followed by a number that specifies the number of leading bits, that are removed from each CID.

* * * * *

UNITED STATES PATENT AND TRADEMARK OFFICE
CERTIFICATE OF CORRECTION

| | | |
|---|---|---|
| PATENT NO. | : 7,911,936 B2 | Page 1 of 1 |
| APPLICATION NO. | : 11/690741 | |
| DATED | : March 22, 2011 | |
| INVENTOR(S) | : Shantidev Mohanty et al. | |

It is certified that error appears in the above-identified patent and that said Letters Patent is hereby corrected as shown below:

In drawing sheet 1 of 3, figure 1, in Box 110, line 3, delete "the the" and insert -- the --, therefor.

In column 11, lines 1-2, in Claim 14, delete "r and in" and insert -- r and s in --, therefor.

Signed and Sealed this
Fourteenth Day of June, 2011

David J. Kappos
*Director of the United States Patent and Trademark Office*